United States Patent
Lee et al.

(10) Patent No.: US 7,602,239 B2
(45) Date of Patent: Oct. 13, 2009

(54) VARIABLE GAIN AMPLIFIER CIRCUITS

(75) Inventors: Wei-Liang Lee, Taipei (TW);
Chih-Chien Huang, Yunlin Hsien (TW);
Chien-Ming Chen, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/056,328

(22) Filed: Mar. 27, 2008

(65) Prior Publication Data

US 2009/0066419 A1    Mar. 12, 2009

Related U.S. Application Data

(60) Provisional application No. 60/970,268, filed on Sep. 6, 2007.

(51) Int. Cl.
*H03F 1/36*    (2006.01)
(52) U.S. Cl. .......................... 330/86; 330/254; 330/282
(58) Field of Classification Search ................... 330/51, 330/254, 259, 260, 278, 282, 284, 290
See application file for complete search history.

(56) References Cited

U.S. PATENT DOCUMENTS 7,057,454 B2 *   6/2006   Ma et al. ....................... 330/86
7,545,209 B2 *   6/2009   Hughes ........................ 330/86

* cited by examiner

*Primary Examiner*—Khanh V Nguyen
(74) *Attorney, Agent, or Firm*—Thomas, Kayden, Horstemeyer & Risley

(57) ABSTRACT

A variable gain amplifier circuit has an amplifier, a string of resistors, a plurality of gain switches, a current source, and at least two current switches. A first input terminal of the amplifier receives an input voltage signal. The string of resistors are coupled between an output terminal of the amplifier and a bias voltage input terminal. Each of the gain switches is coupled between a second input terminal of the amplifier and one of connection nodes between two of the resistors. Each of the current switches is coupled between the current source and one of the connection nodes. The current source provides a current through the turned-on current switch.

16 Claims, 3 Drawing Sheets

VARIABLE GAIN AMPLIFIER CIRCUITS

CROSS REFERENCE TO RELATED APPLICATIONS

The present application claims the benefit of U.S. Provisional Application entitled "VARIABLE GAIN AMPLIFIER CIRCUITS", Ser. No. 60/970,268, filed Sep. 6, 2007.

BACKGROUND OF THE INVENTION

1. Field of the Invention

The invention relates to a variable gain amplifier circuit, and more particularly to a variable gain amplifier circuit with offset compensation.

2. Description of the Related Art

FIG. 1 shows a conventional variable gain amplifier circuit with an offset compensation. With switches SW11, SW12, and SW13, a gain for the VGA circuit can be determined according to the resistances of the resistors R11~R14 and a bias voltage signal Vb. A current source 11 provides a current Iofs to the node N13 (referred to current injection node) between the resistors R13 and R14 for offset compensation. The DC level of the output voltage signal Vout can be controlled by adjusting the amount of the current Iofs. However, if there is a voltage difference (so-called DC offset) between an input voltage signal Vin and the bias voltage signal Vb or the amplifier 10 initially has an input offset itself, the current source 11 will be unable to provide an appropriate current Iofs for performing the correct offset compensation while the VGA circuit is set to have a high gain.

FIG. 2 is an equivalent circuit illustrating the conventional variable gain amplifier circuit with an offset compensation in FIG. 1 when the switch SW11 is turned on. Referring to FIGS. 1 and 2, the sum of the resistances of the resistors R21 and R22 of FIG. 2 is equal to the sum of the resistances of the resistors R11~R13 of FIG. 1, and the resistor R23 of FIG. 2 corresponds to the resistor R14 of FIG. 1. Thus, the output voltage signal Vout is obtained by:

$$Vout = Vin\left(1 + \frac{R22 + R23}{R21}\right) - Vb\left(\frac{R22 + R23}{R21}\right) - IofsR23 \quad \text{(Equation 1)}$$
$$= Vin + \left(\frac{R22 + R23}{R21}\right)(Vin - Vb) - IofsR23$$

The voltage Vn13 at the current injection node N13 is obtained by:

$$Vn13 = Vin + (Vout - Vin)\left(\frac{R22}{R22 + R23}\right) \quad \text{(Equation 2)}$$
$$= Vin + \frac{R22}{R21}(Vin - Vb)$$

It is assumed that there is a DC offset between the input voltage signal Vin and the bias voltage signal Vb, e.g. (Vin-Vb). According to Equation 2, as $$\frac{R22}{R21}$$

increases, the voltage Vn13 at the current injection node N13 is raised or lowered, such that a transistor within the current source 11 can not be normally operated in the saturation region when the voltage Vn13 is excessively large or small. That is, the current source 11 may not provide the appropriate current Iofs when VGA circuit has a high gain for the input voltage signal Vin, for example, when the switch SW11 or SW12 is turned on.

It is desired to provide a variable gain amplifier circuit which can be selectively applied a current at one of the current injection nodes in order to achieve offset compensation.

BRIEF SUMMARY OF THE INVENTION

Variable gain amplifier circuits are provided. An exemplary embodiment of a variable gain amplifier circuit amplifies an input voltage signal to generate an output voltage signal and comprises an amplifier, a string of resistors, a plurality of gain switches, a current source, and at least two current switches. The amplifier has a first input terminal receiving the input voltage signal, a second input terminal, and an output terminal outputting the output voltage signal. The string of resistors is coupled between the output terminal and a bias voltage input terminal. Each of the gain switches is coupled between the second input terminal and one of connection nodes between two of the resistors. The current source is arranged to provide a current. Each of the at least two current switches is coupled between the current source and one of the connection nodes.

Another exemplary embodiment of a variable gain amplifier circuit amplifies an input voltage signal to generate an output voltage signal and comprises an amplifier, a string of resistors, a plurality of gain switches, a determination unit, and an offset compensation circuit. The amplifier has a first input terminal receiving the input voltage signal, a second input terminal, and an output terminal outputting the output voltage signal. The string of resistors is coupled between the output terminal and a bias voltage input terminal receiving a bias voltage signal. Each of the gain switches is coupled between the second input terminal and one of connection nodes between two of the resistors. The determination unit is arranged to receive the output voltage signal and generate a control signal according whether a direct-current voltage level of the output voltage signal exceeds the limit level. The offset compensation circuit is arranged to selectively provide a current to one of the connection nodes according to the control signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 2 is an equivalent circuit of the variable gain amplifier circuit of FIG. 1 when one of the switches SW11~SW13 is turned on.

DETAILED DESCRIPTION OF THE INVENTION

Figure 1:
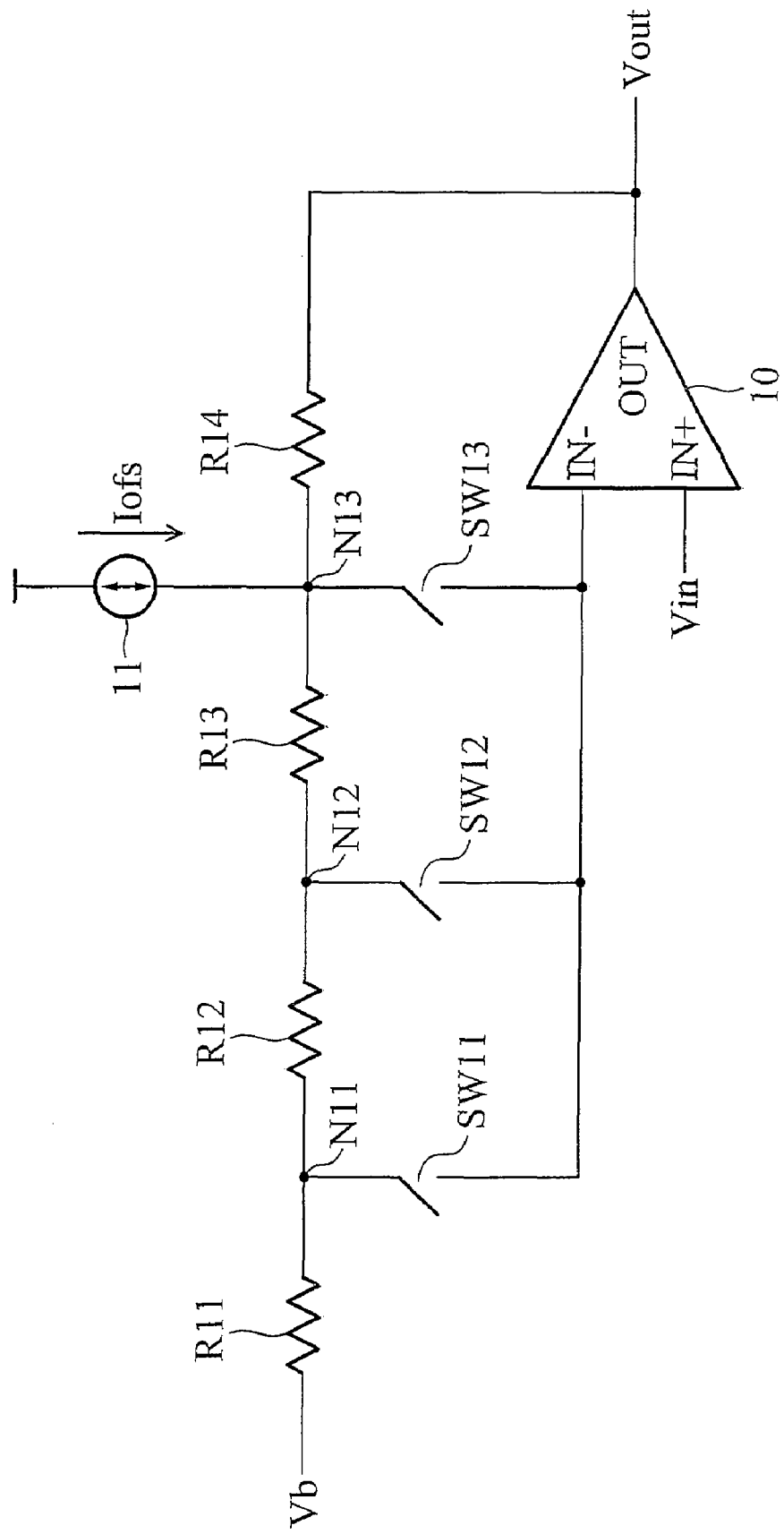
FIG. 1 is a conventional variable gain amplifier circuit with an offset compensation function.
Figure 2:
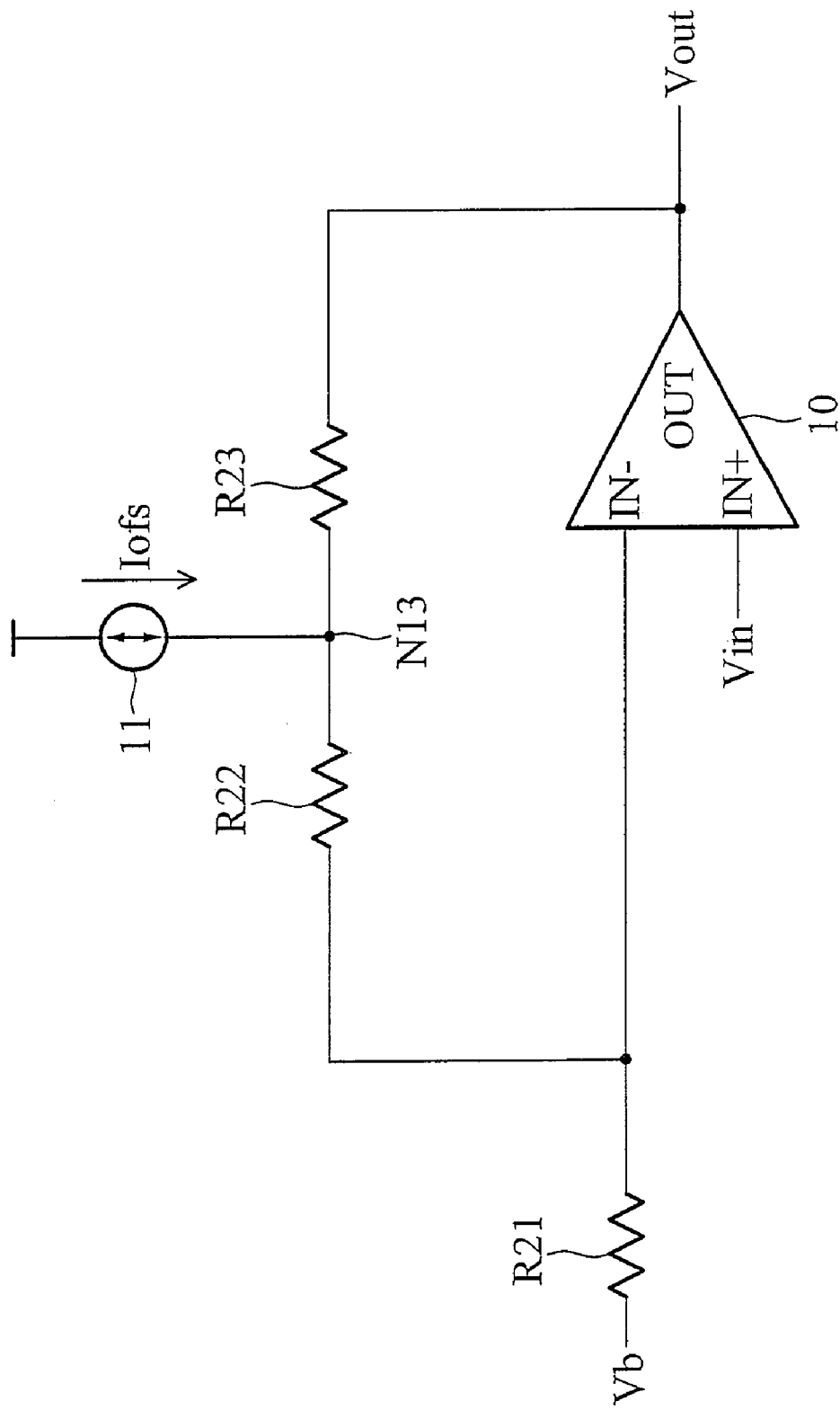

The following description is of the best-contemplated mode of carrying out the invention. This description is made for the purpose of illustrating the general principles of the invention and should not be taken in a limiting sense. The scope of the invention is best determined by reference to the appended claims.

Variable gain amplifier circuits are provided. In an exemplary embodiment of a variable gain amplifier circuit in FIG. 3, a variable gain amplifier circuit 3 comprises an amplifier 30, a string of resistors R1~Rx, a plurality of gain switches GSW1~GSWn, an offset compensation circuit 31 which includes a current source 33 and at least two current switches CSW1~CSWm, and a determination unit 32. In this embodiment, m is less than or equal to n. The variable gain amplifier circuit 3 amplifies an input voltage signal Vin by a gain to generate an output voltage signal Vout. The amplifier 30 has a non-inverting input terminal IN+ which receives the input voltage signal Vin, an inverting input terminal IN−, and an output terminal OUT which outputs the output voltage signal Vout. The string of resistors R1~Rx is coupled between the output terminal OUT and a bias voltage input terminal BN which a bias voltage signal is applied to.

Two of the resistors R1~Rx are coupled at a connection node CN, for example, the resistors R1 and R2 are coupled at a connection node CN1, and the resistors Rx-1 and Rx are coupled at a connection node CNn. Each of the gain switches GSW1~GSWn is coupled between the inverting input terminal IN− and one of the connection nodes CN1~CNn-1. For example, the gain switch GSW1 is coupled between the inverting input terminal IN− and the connection nodes CN1, and the gain switch GSWn is coupled between the inverting input terminal IN− and the connection nodes CNn. When one of the gain switches GSW1~GSWn is turned on, the gain used to amplify the input voltage signal Vin is determined by the values of the resistors R1~Rx and the bias voltage signal Vb.

Figure 3:
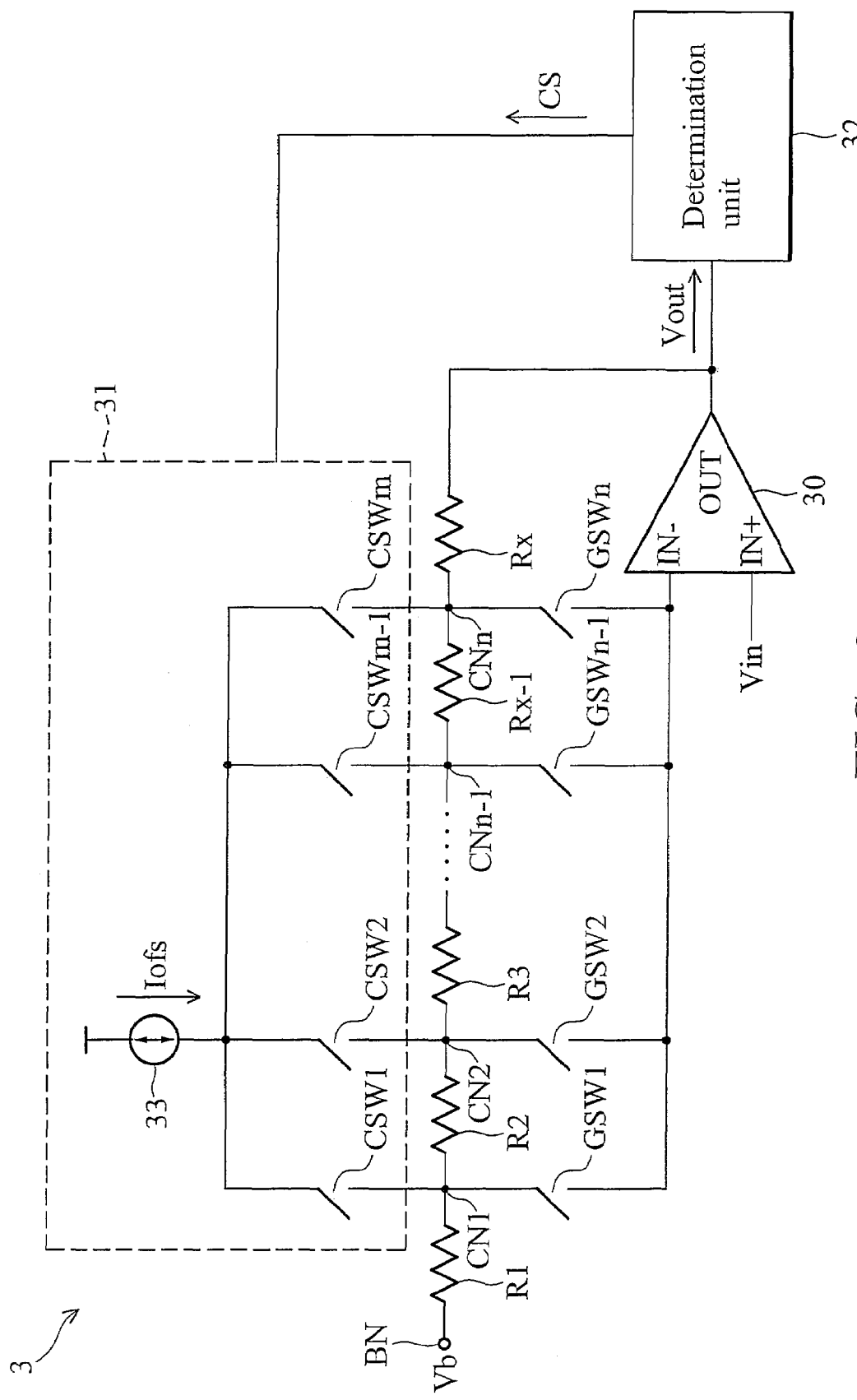
FIG. 3 is an exemplary embodiment of a variable gain amplifier circuit.

The offset compensation circuit 31 comprises a current source 33 and at least two current switches CSW1~CSWm. The at least two current switches CSW1~CSWm comprises a first current switch CSWm coupled to one of the connection nodes closest to the output terminal OUT of the variable gain amplifier 30 and a second current switch CSW1 coupled to one of the connection nodes closest to the bias voltage input terminal BN. In the embodiment of FIG. 3, the number of current switches CSW is equal to the number of the gain switches GSW, that is, m is equal to n. Each of the current switches CSW1~CSWm is coupled between the current source 33 and one of the connection nodes CN1~CNn-1. For example, the current switch CSW1 is coupled between the current source 33 and the connection nodes CN1, and the current switch CSWm is coupled between the current source 33 and the connection nodes CNn. The current source 33 selectively provides a current Iofs to one of the connection nodes CN1~CNn-1. The offset compensation for the output voltage signal Vout is described as following.

The determination unit 32 defines a limit level. The determination unit 32 receives the output voltage signal Vout and determines whether a direct-current (DC) voltage level of the output voltage signal Vout exceeds the limit level. In this embodiment, the limit level can be an upper limit level or a lower limit level. Thus, if the limit level is an upper limit, the determination unit 32 is used to determine whether the direct-current (DC) voltage level of the output voltage signal Vout is larger than the upper limit level; and if the limit level is a lower limit, the determination unit 32 is used to determine whether the direct-current (DC) voltage level of the output voltage signal Vout is less than the upper limit level. In some embodiments, the determination units 32 can define a level range and determine whether the direct-current (DC) voltage level of the output voltage signal Vout excesses the level range. The determination unit 32 generates a control signal CS according the determined result to control ON/OFF states of the current switches CSW1~CSWm. In one embodiment, directed by control signal CS, at any time point, only one current switch is turned on while the other current switches are turned off. The current source 33 provides a current Iofs to the corresponding connection node (referred to current injection node) through the turned-on current switch. For example, the control signal generated by the determination unit 32 has at least two bits, and each of the at least two bits is used to control one of the at least two current switches.

As the above describes, when there is the difference (referred to DC offset) between an input voltage signal Vin and a bias voltage signal Vb or the amplifier 30 comprises an input offset, for a determined gain, the DC offset is gradually amplified from the connection node CN1 to the connection node CNn-1. If one of the current switches CSW1~CSWm is turned on and the voltage at the corresponding connection node (current injection node) is excessively high or low, the current source 33 may not provide the appropriate current Iofs. Accordingly, the DC voltage level of the output voltage signal Vout may exceed the limit level.

In the embodiment of FIG. 3, when the gain is determined by gain switches GSW1~GSWn, the determination unit 32 may firstly generate the control signal CS to control the current switch CSWm, which is closest to the output terminal OUT, to be initially turned on, that is the connection node CNm serves as a current injection node. If the determination unit 32 determines that the DC voltage level of the output voltage signal Vout exceeds the limit level, it generates the control signal CS to turn off the current switch CSWm and turn on the previous current switch CSWm-1, and the current Iofs is injected at the current injection node CNm-1 instead of the connection node CNm. The determination unit 32 continuously performs determining the output voltage signal Vout and changing current injection node, until it is determined that the DC voltage level of the output voltage signal Vout corresponding to a certain turned-on current switch CSW does not exceed the limit level. Meanwhile, the determination unit 32 repeats above process every time when the gain is changed. It is noted that the switching sequence of the current switches CSW1~CSWm is not limited by this embodiment, that is, the switching sequence may start from the current switch CSW1 to the current switch CSWm and the current switches may be respectively switched by two or more current switches, such as CSWm, CSWm-2, CSWm-4 and so on corresponding to different time points.

According to the embodiment, when the gain is determined, one of the connection nodes is finally selected to serve as a proper current injection node for offset compensation, so that the voltage at the current injection node is not excessively high or low. As a result, the transistors implemented in the current source CS, either NMOS transistor or PMOS transistor can be operated in its saturation region such that the current source 33 provides the current Iofs well. Moreover, The DC voltage level of the output voltage signal Vout can be properly adjusted and not exceed the predetermined limit level.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A variable gain amplifier circuit for amplifying an input voltage signal to generate an output voltage signal, comprising:
    an amplifier having a first input terminal receiving the input voltage signal, a second input terminal, and an output terminal outputting the output voltage signal;
    a string of resistors coupled between the output terminal and a bias voltage input terminal;
    a plurality of gain switches, each coupled between the second input terminal and one of connection nodes between two of the resistors;
    a current source for providing a current; and
    at least two current switches, each coupled between the current source and one of the connection nodes.

2. The variable gain amplifier circuit as claimed in claim 1 further comprising a determination unit for generating a control signal according to whether a direct-current (DC) voltage level of the output voltage signal exceeds a limit level to control the at least two current switches.

3. The variable gain amplifier circuit as claimed in claim 2, wherein the at least two current switches comprises a first current switch coupled to one of the connection nodes closest to the output terminal and a second current switch coupled to one of the connection nodes closest to the bias voltage input terminal.

4. The variable gain amplifier circuit as claimed in claim 3, wherein the first current switch is initially turned on, and when the DC voltage level of the output voltage signal exceeds the limit level, the determination unit generates the control signal to turn on the second current switch and turn off the first current switch.

5. The variable gain amplifier circuit as claimed in claim 3, wherein the current source provides the current of a first amount when the first current switch is turned on, the current source provides the current of a second amount when the second current switch is turned on, and the first amount is larger than the second amount.

6. The variable gain amplifier circuit as claimed in claim 2, wherein the control signal has at least two bits, and each of the at least two bits is used to control one of the at least two current switches.

7. The variable gain amplifier circuit as claimed in claim 1, wherein the number of current switches is equal to or less than the number of gain switches.

8. The variable gain amplifier circuit as claimed in claim 1, wherein at any time point, only one of the at least two current switches is turned on.

9. A variable gain amplifier circuit for amplifying an input voltage signal to generate an output voltage signal, comprising:
    an amplifier having a first input terminal receiving the input voltage signal, a second input terminal, and an output terminal outputting the output voltage signal;
    a string of resistors coupled between the output terminal and a bias voltage input terminal receiving a bias voltage signal;
    a plurality of gain switches, each coupled between the second input terminal and one of connection nodes between two of the resistors;
    a determination unit for receiving the output voltage signal, wherein the determination unit is arranged to generate a control signal according whether a direct-current (DC) voltage level of the output voltage signal exceeds a limit level; and
    an offset compensation circuit for selectively providing a current to one of the connection nodes according to the control signal.

10. The variable gain amplifier circuit as claimed in claim 9, wherein the offset compensation circuit comprises:
    a current source providing a current;
    at least two current switches, each coupled between the current source and one of the connection nodes;
    wherein according to the control signal, one of the at least two current switches is turned on at a time point, and the current source provides the current to the corresponding connection nodes through the turned-on current switch.

11. The variable gain amplifier circuit as claimed in claim 10, wherein the at least two current switches comprises a first current switch coupled to one of the connection nodes closest to the output terminal and a second current switch coupled to one of the connection nodes closest to the bias voltage input terminal.

12. The variable gain amplifier circuit as claimed in claim 11, wherein the first current switch is initially turned on, and when the DC voltage level of the output voltage signal exceeds the limit level, the determination unit generates the control signal to turn on the second current switch and turn off the first current switch.

13. The variable gain amplifier circuit as claimed in claim 11, wherein the current source provides the current of a first amount when the first current switch is turned on, the current source provides the current of a second amount when the second current switch is turned on, and the first amount is larger than the second amount.

14. The variable gain amplifier circuit as claimed in claim 11, wherein when one of the gain switches is turned on, a gain used to amplify the input voltage signal is determined by values of the resistors and the bias voltage signal.

15. The variable gain amplifier circuit as claimed in claim 10, wherein the control signal has at least two bits, and each of the at least two bits is used to control one of the at least two current switches.

16. The variable gain amplifier circuit as claimed in claim 10, wherein the number of current switches is equal to or less than the number of the gain switches.

* * * * *